(12) United States Patent
Molnar et al.

(10) Patent No.: US 8,280,934 B2
(45) Date of Patent: Oct. 2, 2012

(54) FREQUENCY DIVIDING SYSTEMS AND METHODS

(75) Inventors: Alyosha C. Molnar, Costa Mesa, CA (US); Rahul Magoon, Irvine, CA (US)

(73) Assignee: Mediatek, Inc., Hsinchu (TW)

( * ) Notice: Subject to any disclaimer, the term of this patent is extended or adjusted under 35 U.S.C. 154(b) by 925 days.

(21) Appl. No.: 11/841,394

(22) Filed: Aug. 20, 2007

(65) Prior Publication Data

US 2007/0286328 A1    Dec. 13, 2007

Related U.S. Application Data

(63) Continuation of application No. 09/821,833, filed on Mar. 30, 2001, now Pat. No. 7,272,620, and a continuation-in-part of application No. 09/370,099, filed on Aug. 6, 1999, now Pat. No. 6,707,326.

(51) Int. Cl.
   *G06F 7/52*    (2006.01)
(52) U.S. Cl. ........................................................ 708/103
(58) Field of Classification Search ............ 708/270–277
   See application file for complete search history.

(56) References Cited

U.S. PATENT DOCUMENTS

| | | | | |
|---|---|---|---|---|
| 3,571,728 A | * | 3/1971 | Andrea et al. | ................... 377/48 |
| 3,649,923 A | * | 3/1972 | Venturini | ..................... 327/115 |
| 3,943,379 A | * | 3/1976 | McGuffin | ..................... 377/115 |
| 4,204,264 A | | 5/1980 | Lipman | |
| 4,354,188 A | * | 10/1982 | Schneider | ..................... 377/48 |
| 4,531,098 A | | 7/1985 | Reed | |
| 4,560,945 A | | 12/1985 | Olver | |
| 4,606,059 A | | 8/1986 | Oida | |
| 5,077,764 A | | 12/1991 | Yamashita | |
| 5,144,254 A | | 9/1992 | Wilke | |
| 5,172,400 A | * | 12/1992 | Maemura | ..................... 377/116 |
| 5,206,539 A | | 4/1993 | Kammeter | |
| 5,343,080 A | | 8/1994 | Kammeter | |
| 5,425,074 A | | 6/1995 | Wong | |
| 5,434,455 A | | 7/1995 | Kammeter | |
| 5,442,670 A | * | 8/1995 | Shu | ................................. 377/48 |
| 5,557,649 A | | 9/1996 | Scheckel et al. | |
| 5,594,735 A | | 1/1997 | Jokura | |
| 5,614,869 A | | 3/1997 | Bland | |
| 5,841,302 A | | 11/1998 | Ishii et al. | |
| 5,859,890 A | | 1/1999 | Shurboff et al. | |
| 5,867,068 A | | 2/1999 | Keating | |
| 6,072,850 A | * | 6/2000 | Ueno | ................................. 377/47 |
| 6,163,181 A | | 12/2000 | Nishiyama | |
| 6,356,123 B1 | | 3/2002 | Lee et al. | |
| 6,389,095 B1 | * | 5/2002 | Sun | ................................. 377/48 |
| 6,707,326 B1 | * | 3/2004 | Magoon et al. | ................. 377/48 |
| 6,882,229 B1 | * | 4/2005 | Ho et al. | ..................... 331/1 A |
| 7,579,883 B2 | * | 8/2009 | Dekate et al. | ................ 327/117 |
| 2004/0160247 A1 | | 8/2004 | Magoon et al. | |

* cited by examiner

*Primary Examiner* — Tan V. Mai
(74) *Attorney, Agent, or Firm* — Thomas|Kayden (57) ABSTRACT

Systems and methods for producing a frequency divider output signal having a period substantially equal to three times a period of a reference input signal, comprising configuring each of three storage elements to receive a first input, a second input, and a reference input signal, and to provide a storage element output, obtaining a frequency divider output signal from at least one storage element output, and using the storage element output from each of the three storage elements as an input to another one of the three storage elements, where a phase difference between the output of the first storage element and the output of the second storage element is substantially equal to 60°.

18 Claims, 12 Drawing Sheets

FREQUENCY DIVIDING SYSTEMS AND METHODS

CLAIM OF PRIORITY

This application is a continuation of copending U.S. utility application entitled, "Frequency Divider with Low Harmonics," having Ser. No. 09/821,833, filed on Mar. 30, 2001, which is a continuation-in-part of copending U.S. utility application entitled "Programmable Frequency Divider," Ser. No. 09/370,099, filed on Aug. 6, 1999, both of which are incorporated by reference in their entirety.

BACKGROUND OF THE INVENTION

1. Field of the Invention

This invention relates to wireless transmitters and receivers and, more particularly, to frequency dividers.

2. Related Art

Harmonics contained in signal processing devices are a major cause of signal distortions. One case where harmonics can be especially problematic is in a limiter that is driven by a poly-phase filter. For example, standard 90° poly-phase outputs take the form of:

0° output=input/(1+$jwRC$)

90° output=input*($jwRC$)/(1+$jwRC$)

Based on this property, harmonic components in the output will be amplitude mismatched and will be phase shifted from the fundamental frequency. Therefore, the presence of harmonics at the input of a poly-phase filter can cause a shift in the zero-crossings at the output of the poly-phase filter. This shift can, in turn, cause an effective phase error when the output of the poly-phase filter is passed through a limiter that reacts primarily to zero crossings.

A second case where harmonics can cause signal distortions is in mixers. The presence of harmonics in a mixer input signal can result in odd-order mixing products ("OMPs") in the mixer's output. An OMP, which is defined as the product of one input and an odd harmonic of another input, can cause signal distortions when its frequency is too close to the frequency of a desired mixer output signal. Other cases where harmonics can cause signal distortions include, for example, where unwanted harmonics couple across a circuit.

Therefore, there exists a need for signal processing systems that have reduced harmonic content.

SUMMARY

In one system embodiment of the invention, a signal processing system configured to produce a divider output signal having a period substantially equal to three times a period of a reference input signal is disclosed, the signal processing system comprising a first storage element, a second storage element, and a third storage element, where each of the three storage elements is configured to receive a first input, a second input, and a reference input signal, and is configured to provide a storage element output, where the divider output signal is obtained from at least one storage element output, and where the storage element output from each of the three storage elements is used to provide at least one input to another one of the three storage elements, where a phase difference between the output of the first storage element and the output of the second storage element is substantially equal to 60°.

In one method embodiment of the invention, a method for producing a frequency divider output signal having a period substantially equal to three times a period of a reference input signal is disclosed, comprising configuring each of three storage elements to receive a first input, a second input, and a reference input signal, and to provide a storage element output, obtaining a frequency divider output signal from at least one storage element output, and using the storage element output from each of the three storage elements as an input to another one of the three storage elements, where a phase difference between the output of the first storage element and the output of the second storage element is substantially equal to 60°

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
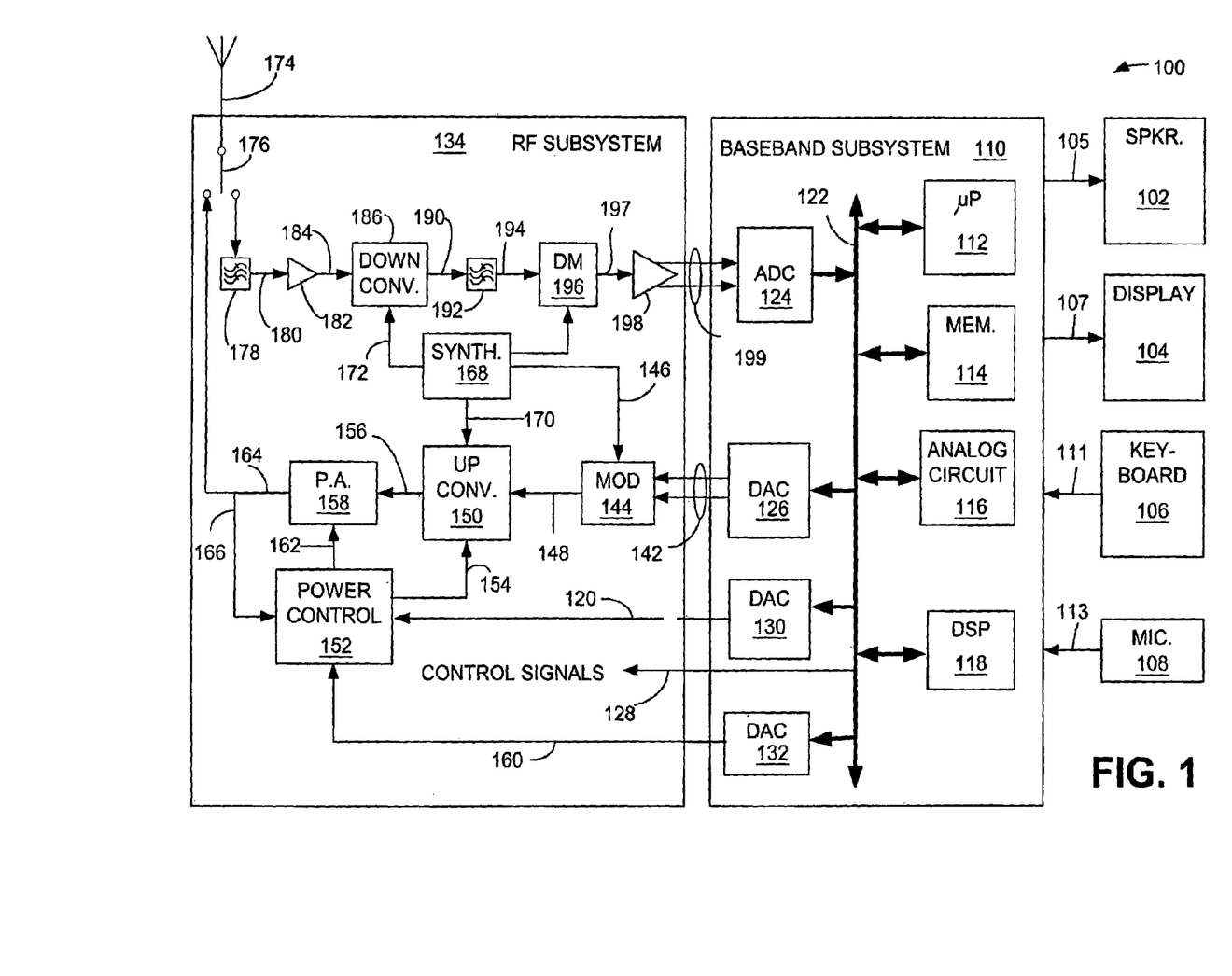
FIG. 1 is a block diagram illustrating a non-limiting example of a simplified portable transceiver.

FIG. 1 is a block diagram illustrating a non-limiting example of a simplified portable transceiver 100 in which an embodiment of the invention may be implemented. Portable transceiver 100 includes speaker 102, display 104, keyboard 106, and microphone 108, all connected to baseband subsystem 110. In a particular embodiment, portable transceiver 100 can be, for example, but not limited to, a portable telecommunication handset such as a mobile cellular-type telephone. Speaker 102 and display 104 receive signals from baseband subsystem 110 via connections 105 and 107, respectively. Similarly, keyboard 106 and microphone 108 supply signals to baseband subsystem 110 via connections 111 and 113, respectively. Baseband subsystem 110 includes microprocessor (μP) 112, memory 114, analog circuitry 116, and digital signal processor (DSP) 118, each coupled to a data bus 122. Examples of commercially available processors include, but are not limited to, an ARM processor such as an ARM 7 or ARM 9 processor, a ZSP Core supplied by LSI Logic or a Teak processor supplied by DSP Group. Data bus 122, although shown as a single bus, may be implemented using multiple busses connected as necessary among the subsystems within baseband subsystem 110. Microprocessor 112 and memory 114 provide signal timing, processing and storage functions for portable transceiver 100. Analog circuitry 116 provides the analog processing functions for the signals within baseband subsystem 110. Baseband subsystem 110 provides control signals to radio frequency (RF) subsystem 134 via connection 128. Although shown as a single connection 128, the control signals may originate from DSP 118 or from microprocessor 112, and may be supplied to a variety of points within RF subsystem 134. It should be noted that, for simplicity, only selected components of a portable transceiver 100 are illustrated in FIG. 1.

Baseband subsystem 110 also includes analog-to-digital converter (ADC) 124 and digital-to-analog converters (DACs) 126, 130 and 132. ADC 124, DAC 126, DAC 130 and DAC 132 communicate with microprocessor 112, memory 114, analog circuitry 116 and DSP 118 via data bus 122. DAC 126 converts digital communication information within baseband subsystem 110 into an analog signal for transmission to RF subsystem 134 via connection 142. In accordance with an aspect of the invention, DAC 130 provides a reference voltage power level signal to power control element 152 via connection 120 and DAC 132 provides an amplitude modulated (AM) signal to power control element 152 via connection 160. Alternatively, circuitry (not shown) could be placed in power control element 152 to derive the AM signal based on the output of DAC 126 received via connection 142. Connection 142, while shown as two directed arrows, includes the information that is to be transmitted by RF subsystem 134 after conversion from the digital domain to the analog domain.

RF subsystem 134 includes modulator 144, which, after receiving an LO signal from synthesizer 168 via connection 146, modulates the received analog information and provides a modulated signal via connection 148 to upconverter 150. Upconverter 150 also receives a frequency reference signal from synthesizer 168 via connection 170. Synthesizer 168 determines the appropriate frequency to which upconverter 150 will upconvert the modulated signal on connection 148.

Upconverter 150 supplies a phase-modulated signal via connection 156 to power amplifier 158. Power amplifier 158 amplifies the modulated signal on connection 156 to the appropriate power level for transmission via connection 164 to antenna 174. Illustratively, switch 176 controls whether the amplified signal on connection 164 is transferred to antenna 174 or whether a received signal from antenna 174 is supplied to filter 178. The operation of switch 176 is controlled by a control signal from baseband subsystem 110 via connection 128. Alternatively, the switch 176 may be replaced with circuitry to enable the simultaneous transmission and reception of signals to and from antenna 174.

A portion of the amplified transmit signal energy on connection 164 is supplied via connection 166 to power control element 152. Power control element 152 forms a closed power control feedback loop and supplies an AM component of the transmit signal via connection 162 to power amplifier 158 and also supplies a power control feedback signal via connection 154 to upconverter 150.

A signal received by antenna 174 will, at the appropriate time determined by baseband system 110, be directed via switch 176 to a receive filter 178. Receive filter 178 filters the received signal and supplies the filtered signal on connection 180 to low noise amplifier (LNA) 182. Receive filter 178 is a bandpass filter, which passes all channels of the particular cellular system in which the portable transceiver 100 is operating. As an example, for a Global System For Mobile Communications (GSM) 900 MHz system, receive filter 178 would pass all frequencies from 935.1 MHz to 959.9 MHz, covering all 124 contiguous channels of 200 kHz each. The purpose of this filter is to reject all frequencies outside the desired region. LNA 182 amplifies the weak signal on connection 180 to a level at which downconverter 186 can translate the signal from the transmitted frequency back to a baseband frequency. Alternatively, the functionality of LNA 182 and downconverter 186 can be accomplished using other elements, such as for example but not limited to, a low noise block downconverter (LNB).

Downconverter 186 receives an LO signal from synthesizer 168, via connection 172. The LO signal is used in the downconverter 186 to downconvert the signal received from LNA 182 via connection 184. The downconverted frequency is called the intermediate frequency ("IF"). Downconverter 186 sends the downconverted signal via connection 190 to channel filter 192, also called the "IF filter." Channel filter 192 filters the downconverted signal and supplies it via connection 194 to demodulator 196. The channel filter 192 selects one desired channel and rejects all others. Using the GSM system as an example, only one of the 124 contiguous channels would be selected by channel filter 192. The synthesizer 168, by controlling the local oscillator frequency supplied on connection 172 to downconverter 186, determines the selected channel. Demodulator 196 recovers the transmitted analog information and supplies a signal representing this information via connection 197 to amplifier 198. Amplifier 198 amplifies the signal received via connection 197 and supplies an amplified signal via connection 199 to ADC 124. ADC 124 converts these analog signals to a digital signal at baseband frequency and transfers it via data bus 122 to DSP 118 for further processing. Although, for illustration purposes, the invention is described below with respect to portable transceiver 100, it should be noted that the invention may also be implemented in any wireless communication system that uses one or more mixers.

Figure 2:
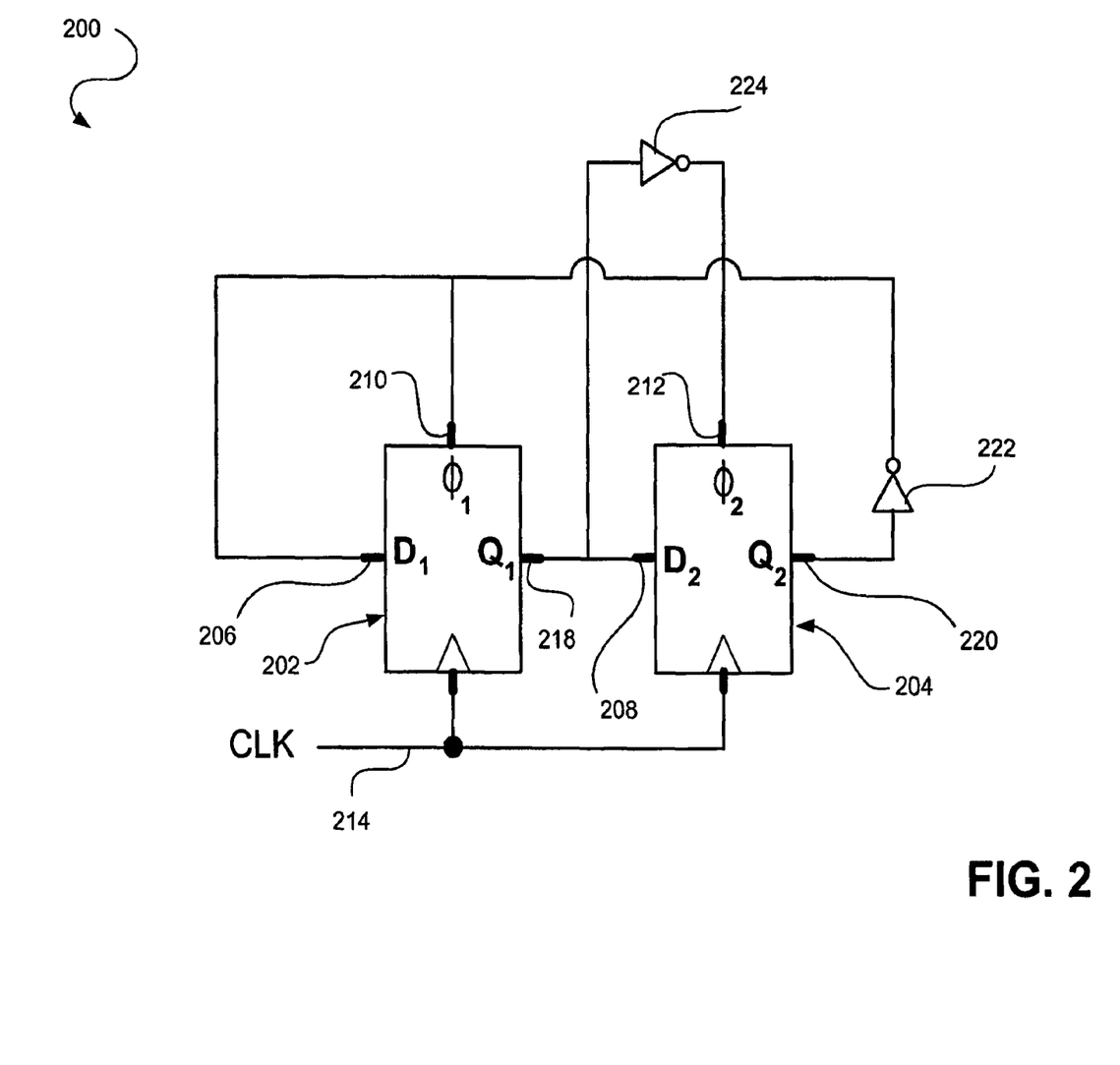
FIG. 2 is a block diagram illustrating an embodiment of a "divide by two" frequency divider.

FIG. 2 is a block diagram illustrating an embodiment of a "divide by two" frequency divider 200 of the invention. The frequency divider 200 includes two storage elements 202 and 204. Storage elements 202 and 204 are configured to receive inputs $D_1$ 206 and $D_2$ 208 respectively, inputs $\phi_1$ 210 and $\phi_2$ 212 respectively, and a reference signal input ("CLK") 214. In one embodiment, CLK 214 is an LO signal. The storage elements 202 and 204 also provide outputs $Q_1$ 218 and $Q_2$ 220 and respectively. The frequency of each of the outputs $Q_1$ 218 and $Q_2$ 220 is equal to half of the frequency of CLK 214.

The storage elements 202 and 204 are interconnected as follows: $Q_1$ 218 is connected to $D_2$ 208, $Q_2$ 220 is connected through inverter 222 to $D_1$ 206 and $\phi_1$ 210, and $Q_1$ 218 is connected through inverter 224 to $\phi_2$ 212. Furthermore, in some embodiments, the relationships between the inputs and outputs of each of the storage elements 202 and 204 are defined in Table 1.

TABLE 1

Truth Table For A Frequency Divider Storage Element

| CLK(t) | D(t) | Q(t) | Phi(t) | Q(t + 1) |
|--------|------|------|--------|----------|
| 0 | 0 | 0 | 0 | 0 |
| 0 | 0 | 0 | 1 | 0 |

TABLE 1-continued

Truth Table For A Frequency Divider Storage Element

| CLK(t) | D(t) | Q(t) | Phi(t) | Q(t + 1) |
|---|---|---|---|---|
| 0 | 0 | 1 | 0 | 0 |
| 0 | 0 | 1 | 1 | 1 |
| 0 | 1 | 0 | 0 | 1 |
| 0 | 1 | 0 | 1 | 0 |
| 0 | 1 | 1 | 0 | 1 |
| 0 | 1 | 1 | 1 | 1 |
| 1 | 0 | 0 | 0 | 0 |
| 1 | 0 | 0 | 1 | 0 |
| 1 | 0 | 1 | 0 | 1 |
| 1 | 0 | 1 | 1 | 0 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

The states "1" and "0" in Table 1 are commonly referred to as "high" and "low" states, respectively, and are typically represented by distinguishable voltage levels such as, for example, "positive" and "negative" voltages, or "higher" and "lower" voltages. The relationships between the inputs and outputs of each of the storage elements 202 and 204 may also be described by the following logic equation:

$$/Q_{N+1} = /D(/\phi/CLK + \phi CLK) + /Q_N(/\phi CLK + \phi/CLK)$$

(where a slash ("/") means "inverse of" such that $/\phi$, for example, is the inverse of $\phi$, and where the subscript "$_N$" refers to a current state and the subscript "$_{N+1}$" refers to the state that is immediately following the current state).

Figure 3:
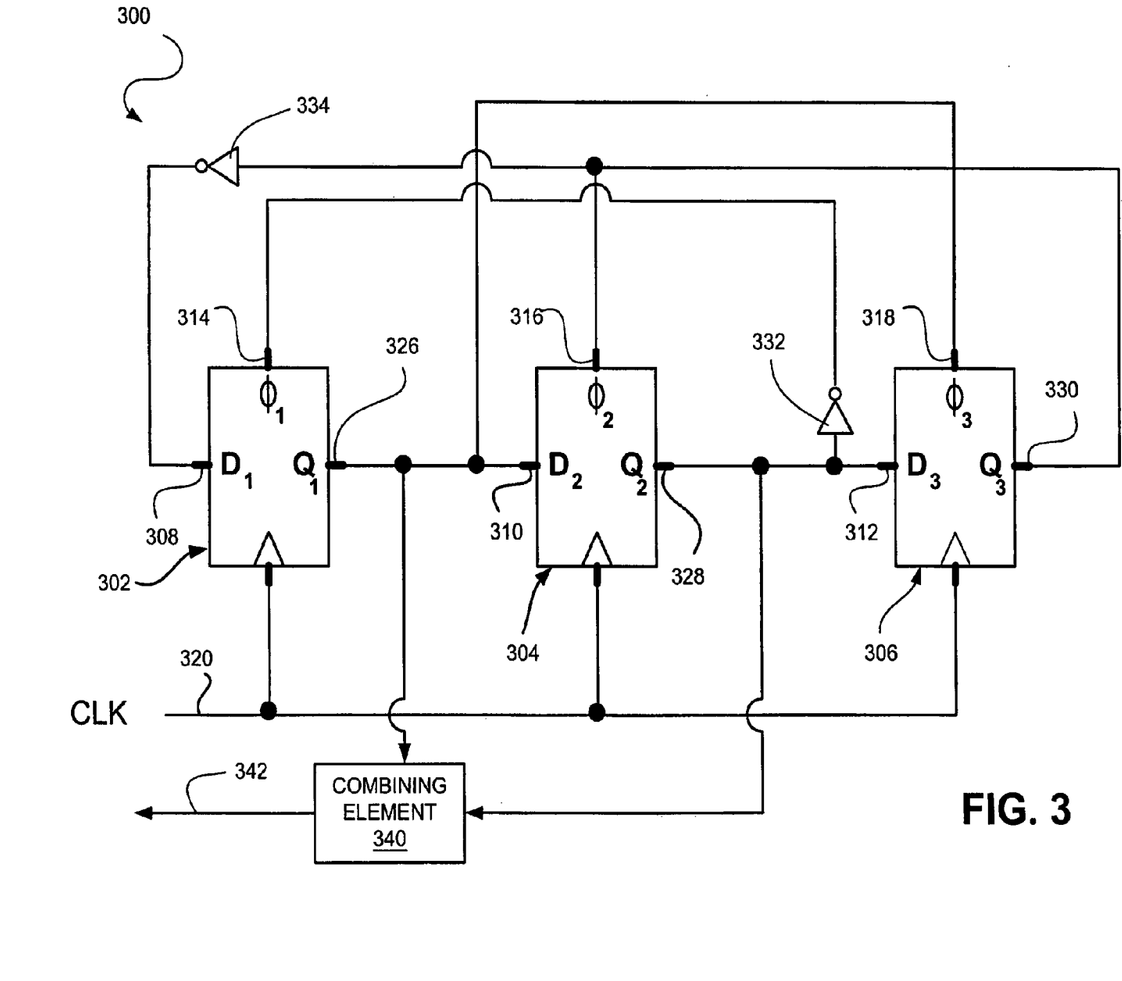
FIG. 3 is a block diagram illustrating an embodiment of a "divide by three" frequency divider.

FIG. 3 is a block diagram illustrating an embodiment of a "divide by three" frequency divider 300 of the invention. The frequency divider 300 includes three storage elements 302, 304 and 306. Storage element 302 is configured to receive inputs $D_1$ 308, $\phi_1$ 314, and CLK 320 and to provide output $Q_1$ 326. Storage element 304 is configured to receive inputs $D_2$ 310, $\phi_2$ 316, and CLK 320, and to provide output $Q_2$ 328. Storage element 306 is configured to receive inputs $D_3$ 312, $\phi_3$ 318, and CLK 320, and to provide output $Q_3$ 330. Storage elements 302, 304, and 306 are interconnected as follows: $Q_1$ 326 is connected to $D_2$ 310 and $\phi_3$ 318, $Q_3$ 330 is connected via inverter 334 to $D_1$ 308, $Q_2$ 328 is connected to $D_3$ 312, and $Q_2$ 328 is connected via inverter 332 to $\phi_1$ 314. Furthermore, in one implementation, storage elements 302, 304, and 306 are configured to behave in accordance with the logic relationships shown in Table 1 above.

The frequency of each of the outputs $Q_1$ 326, $Q_2$ 328, and $Q_3$ 330, has a frequency equal to one third of the frequency of the clock signal input. Two of the outputs $Q_1$ 326, $Q_2$ 328, and $Q_3$ 330 may be combined to produce a system output having substantially no third-order harmonics, as will be explained further below. In the example shown in FIG. 3, $Q_1$ 326 and $Q_2$ 328 are combined via combining element 340 to produce low harmonics output 342. Combining element 340 may be, for example, a combiner, an adder, or merely a node that sums currents.

Figure 4:
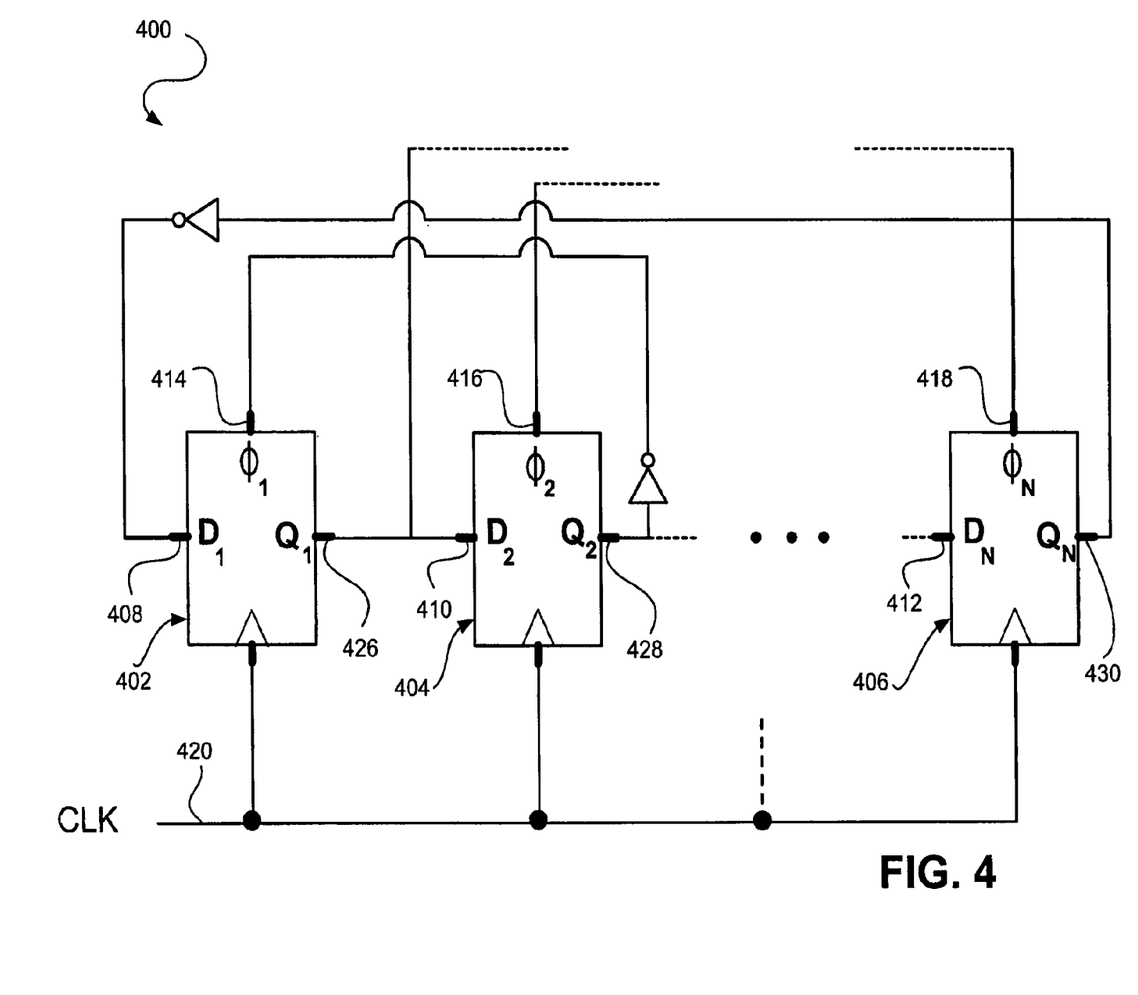
FIG. 4 is a block diagram illustrating an embodiment of a "divide by N" frequency divider.

FIG. 4 is a block diagram illustrating an embodiment of a "divide by N" frequency divider 400 of the invention. The frequency divider 400 includes N storage elements including a first storage element 402, a second storage element 404, an $N^{th}$ storage element 406, and one or more additional storage elements (not shown). Storage element 402 is configured to receive inputs $D_1$ 408, $\phi_1$ 414, and CLK 420 and to provide output $Q_1$ 426. Storage element 404 is configured to receive inputs $D_2$ 410, $\phi_2$ 416, and CLK 420, and to provide output $Q_2$ 428. Storage element 406 is configured to receive inputs $D_N$ 412, $\phi_N$ 418, and CLK 420, and to provide output $Q_N$ 430. Each of the output signals $Q_1$ 426, $Q_2$ 428, and $Q_N$ 430, has a frequency equal to the frequency of the clock signal input divided by the number of interconnected storage elements N. Storage elements 402, 404, and 406 are interconnected as follows:

$Q_k$ is connected to $D_{k-1}$
$Q_1$ is connected to $/D_N$
$D_k$ is connected to $Q_{k-1}$ for k=2 to N
$\phi_k$ is connected to $/Q_{k+1}$ for odd k less than N
$\phi_k$ is connected to $Q_{k+1}$ for even k less than N
$\phi_N$ is connected to $Q_1$ for N=odd integer
$\phi_N$ is connected to $/Q_1$ for N=even integer (where k is an integer assigned to a storage element based on its location in the sequence of N storage elements). In one implementation, storage elements 402, 404, and 406 are configured to behave in accordance with the logic relationships shown in Table 1. Note that since the storage elements are effectively connected in a loop, all connection specifications for even numbered elements and odd numbered elements can be interchanged without a loss in functionality.

Figure 5:
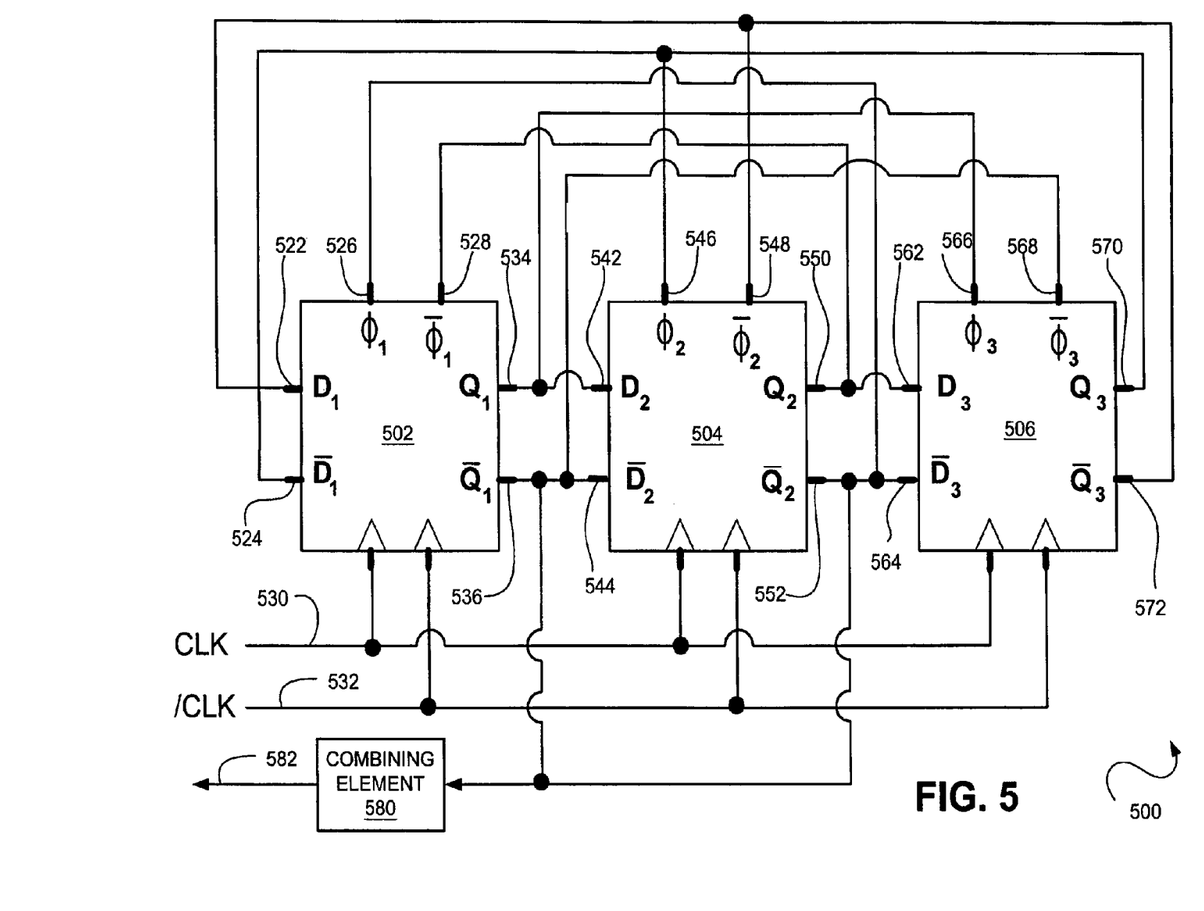
FIG. 5 is a block diagram illustrating an alternative embodiment of a "divide by three" frequency divider.

FIG. 5 is a block diagram illustrating an alternative embodiment of a "divide by three" frequency divider of the invention. Frequency divider 500 includes three storage elements 502, 504 and 506 that are configured as follows: storage element 502 is configured to receive inputs $D_1$ 522, $/D_1$ 524, $\phi_1$ 526, $/\phi_1$ 528, CLK 530, and /CLK 532, and to provide outputs $Q_1$ 534 and $/Q_1$ 536; storage element 504 is configured to receive inputs $D_2$ 542, $/D_2$ 544, $\phi_2$ 546, $/\phi_2$ 548, CLK 530, and /CLK 532, and to provide outputs $Q_2$ 550 and $/Q_2$ 552; and storage element 506 is configured to receive inputs $D_3$ 562, $/D_3$ 564, $\phi_3$ 566, $/\phi_3$ 568, CLK 530, and /CLK 532, and to provide outputs $Q_3$ 570 and $/Q_3$ 572.

Storage elements 502, 504, and 506 are interconnected as follows: $Q_1$ 534 is connected to $D_2$ 542 and $\phi_3$ 566, $/Q_3$ 572 is connected to $D_1$ 522 and to $/\phi_2$ 548, $Q_2$ 550 is connected to $D_3$ 562 and $/\phi_1$ 528, $/Q_1$ 536 is connected to $/D_2$ 544 and $/\phi_3$ 568, $Q_3$ 570 is connected to $/D_1$ 524 and $\phi_2$ 546, and $/Q_2$ 552 is connected to $/D_3$ 564 and $\phi_1$ 526. In one implementation, storage elements 502, 504, and 506 are configured to behave in accordance with the logic properties shown in Table 1.

The frequency of each of the outputs signals $Q_1$ 534, $Q_2$ 550, $Q_3$ 570, $/Q_1$ 536, $/Q_2$ 552, and $/Q_3$ 572, has a frequency equal to one third of the frequency of CLK 530. In one implementation, two of the outputs $Q_1$ 534, $Q_2$ 550, $Q_3$ 570, $/Q_1$ 536, $/Q_2$ 552, and $/Q_3$ 572 may be combined to produce a system output having substantially no third-order harmonics, as will be explained further below. In the example shown in FIG. 5, $/Q_1$ 536 and $/Q_2$ 552 are combined via combining element 580 to produce low harmonics output 582. Combining element 580 may be, for example, a combiner, an adder, or merely a node that sums currents.

Each of the frequency dividers described above may be implemented in any radio frequency (RF) transmitter or receiver that uses frequency division. As a non-limiting example, a frequency divider of the invention may be used in synthesizer 168, modulator 144, demodulator 196, upconverter 150, and/or downconverter 186 (FIG. 1).

Figure 6:
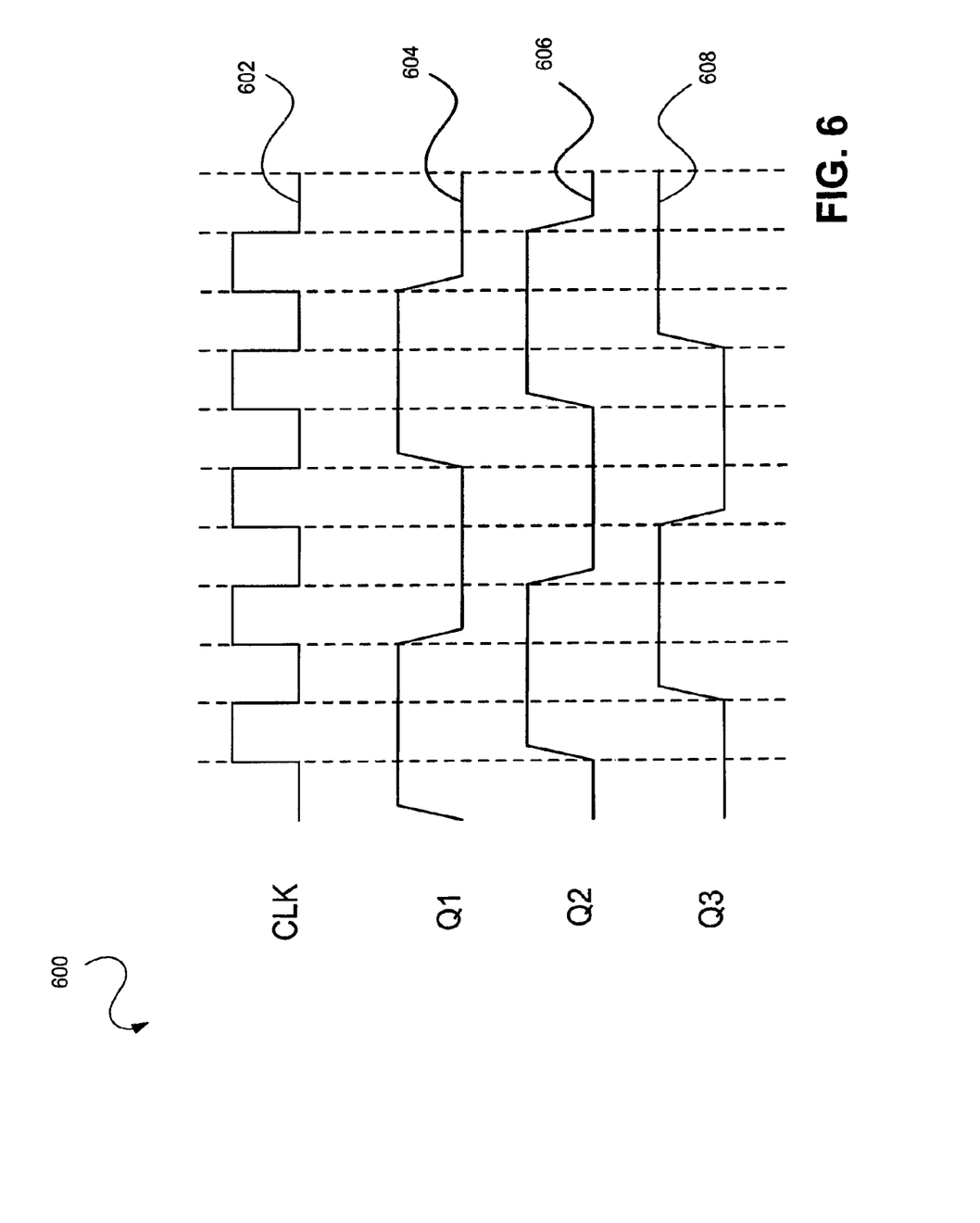
FIG. 6 is a timing diagram illustrating frequency.

FIG. 6 is a timing diagram 600 illustrating frequency division of an embodiment of the invention, such as, for example, frequency divider 500 (FIG. 5), or frequency divider 300 (FIG. 3). The timing diagram illustrates four signals: an input reference signal 602, a first storage element output ($Q_1$) 604, a second storage element output ($Q_2$) 606, and a third storage element output ($Q_3$) 608. Outputs $Q_1$ 604, $Q_2$ 606, and $Q_3$ 608 may correspond, for example, to storage element outputs $Q_1$ 326, $Q_2$ 328 and $Q_3$ 330, respectively (FIG. 3) while the input reference signal 602 may correspond, for example, to CLK 320 (FIG. 3). Each of the outputs ($Q_1$ 604, $Q_2$ 606, and $Q_3$ 608) has a frequency equal to one third of the frequency of the input reference signal 602. As shown in the timing diagram 600, $Q_2$ 606 lags $Q_1$ 604 by ⅙ of a cycle and $Q_3$ 608 lags $Q_2$ 606 by ⅙ of a cycle. It should be noted that, in this example, each of the outputs has a 50% duty cycle. In general, however, the duty cycle of an output signal will be equal to about 33% plus ⅓ of the duty cycle of an input signal.

Figure 7:
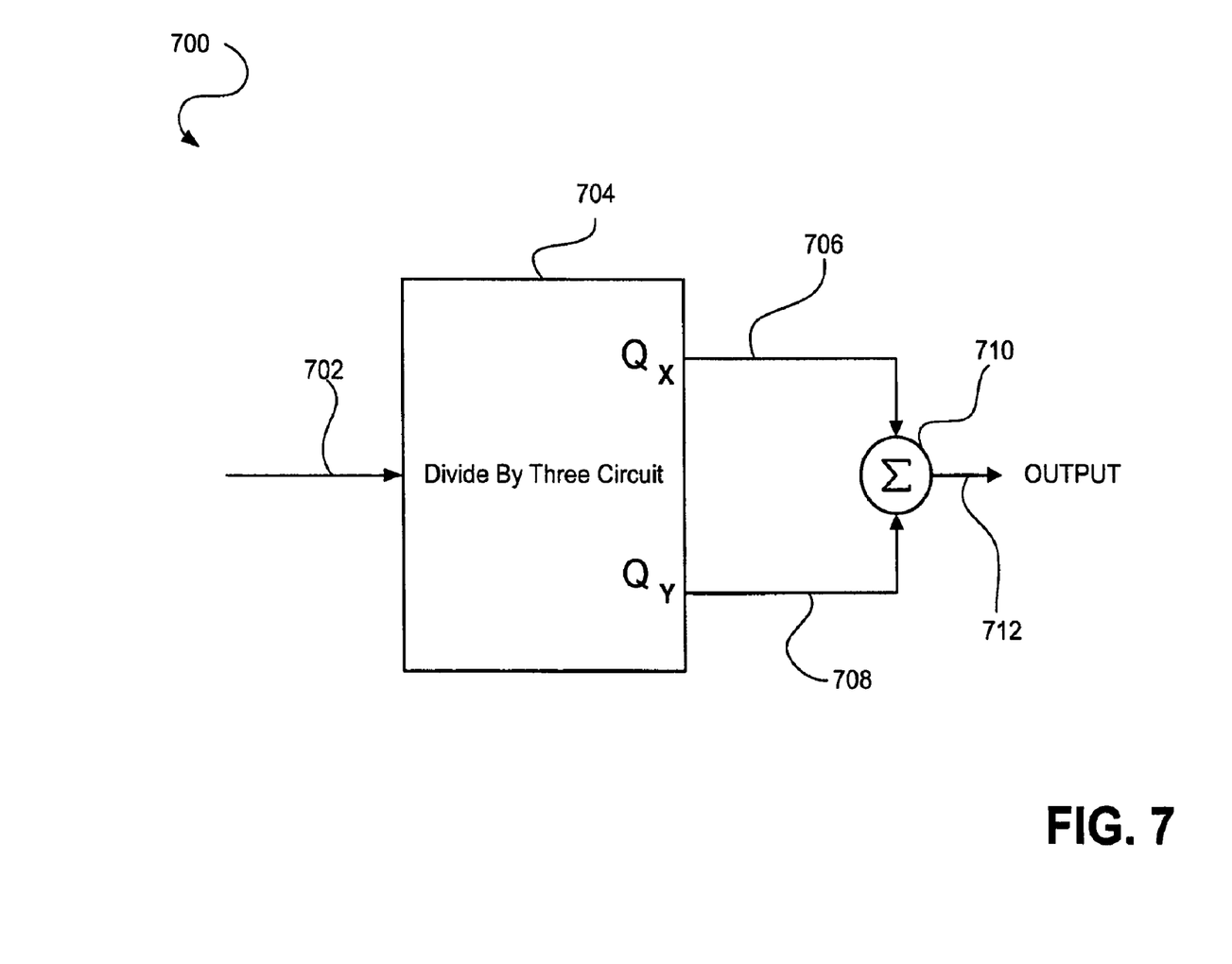
FIG. 7 is a block diagram of a low harmonics frequency division system.

FIG. 7 is a block diagram of a low harmonics frequency division system 700. The low harmonics frequency division system 700 includes a "divide by three" circuit 704. The "divide by three" circuit 704 may correspond, for example, to frequency divider 500 (FIG. 5), or frequency divider 300 (FIG. 3). The divide by three circuit 704 receives an input 702 and produces signals $Q_x$ 706, $Q_y$ 708, and $Q_z$ (not shown). $Q_x$ 706 and $Q_y$ 708 are then combined at combining element 710 to provide a system output 712 having substantially no third-order harmonics. Combining element 710 may be a combiner, an adder, or merely a node that sums $Q_x$ 706 and $Q_y$ 708.

If, for example, the divide by three circuit used is frequency divider 500 (FIG. 5), then $Q_x$ 706 and $Q_y$ 708 may correspond, for example, to one of the following pairs of storage element outputs: $Q_1$ 534 & $Q_2$ 550, /$Q_1$ 536 & /$Q_2$ 552, $Q_2$ 550 & $Q_3$ 570, or /$Q_2$ 552 & /$Q_3$ 572. If, on the other hand, the divide by three circuit used is frequency divider 300 (FIG. 3), then $Q_x$ 706 and $Q_y$ 708 may correspond, for example, to storage element output pairs $Q_1$ 326 & $Q_2$ 328, or $Q_2$ 328 & $Q_3$ 330.

Figure 8:
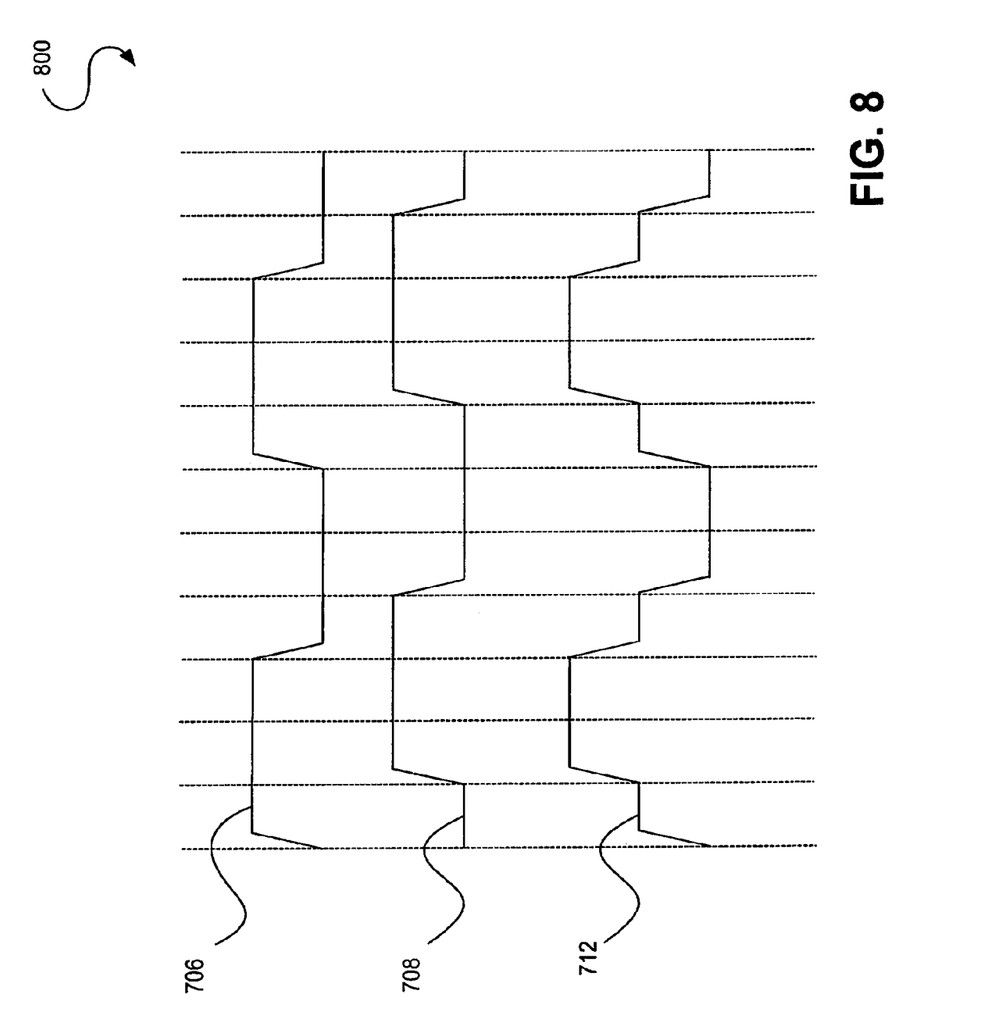
FIG. 8 is an example timing diagram illustrating the addition of frequency divider outputs.

FIG. 8 is an example timing diagram 800 illustrating the addition of $Q_x$ 706 and $Q_y$ 708 shown in FIG. 7 to produce system output 712. In this example, $Q_y$ 708 lags $Q_x$ 706 by ⅙ of a cycle. As shown in timing diagram 800, system output 712 is a step-shaped signal that has the same frequency as $Q_x$ 706 and $Q_y$ 708. Furthermore, although not readily apparent from diagram 800, system output 712 contains substantially no third-order harmonics.

Since $Q_y$ 708 lags $Q_x$ 706 by ⅙ of a cycle (or 60°), each of the odd harmonics of output 708 will lag a corresponding odd harmonic of output 706 by "n" times 60°, where "n" is the harmonic number; for example, the third harmonic of $Q_y$ 708 will lag the third harmonic of $Q_x$ 706 by 180°. Therefore, by adding $Q_x$ 706 and $Q_y$ 708, the resulting system output 712 may have substantially no third-order harmonics.

Figure 9:
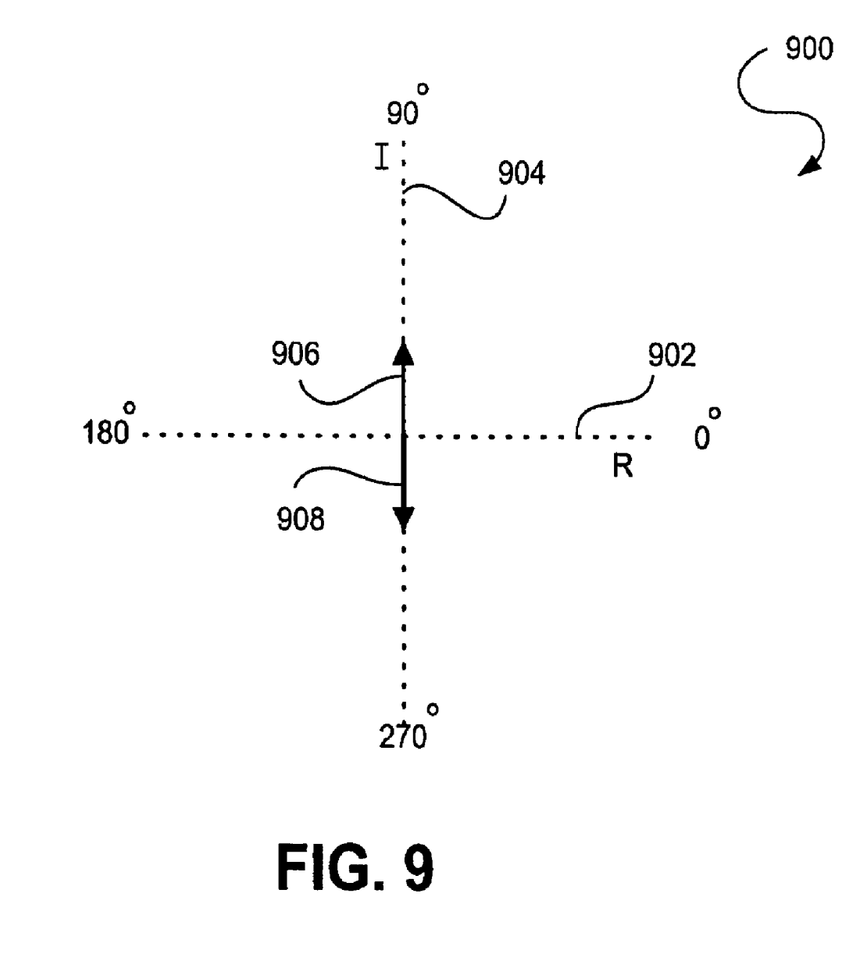
FIG. 9 is a phase diagram illustrating a non-limiting example of third-order harmonics cancellation by the low harmonics frequency division system of FIG. 7.

FIG. 9 is a phase diagrams 900 illustrating a non-limiting example of third-order harmonics cancellation by low harmonics frequency division system 700. Phase diagram 900 includes a "real" axis 902 and an "imaginary" axis 904. Third harmonic components 906 and 908 are contained in signals 706 and 708, respectively (FIG. 7). Components 906 and 908 have the same magnitude but are 180° out of phase. Therefore, by combining signals 706 and 708, third harmonic components 906 and 908, respectively, can effectively cancel each other. Although, for illustration purposes, harmonic components 906 and 908 are shown to have phase angles of 90° and 270°, respectively, the phase angles may in fact have any respective values that are substantially 180° apart.

Figure 10:
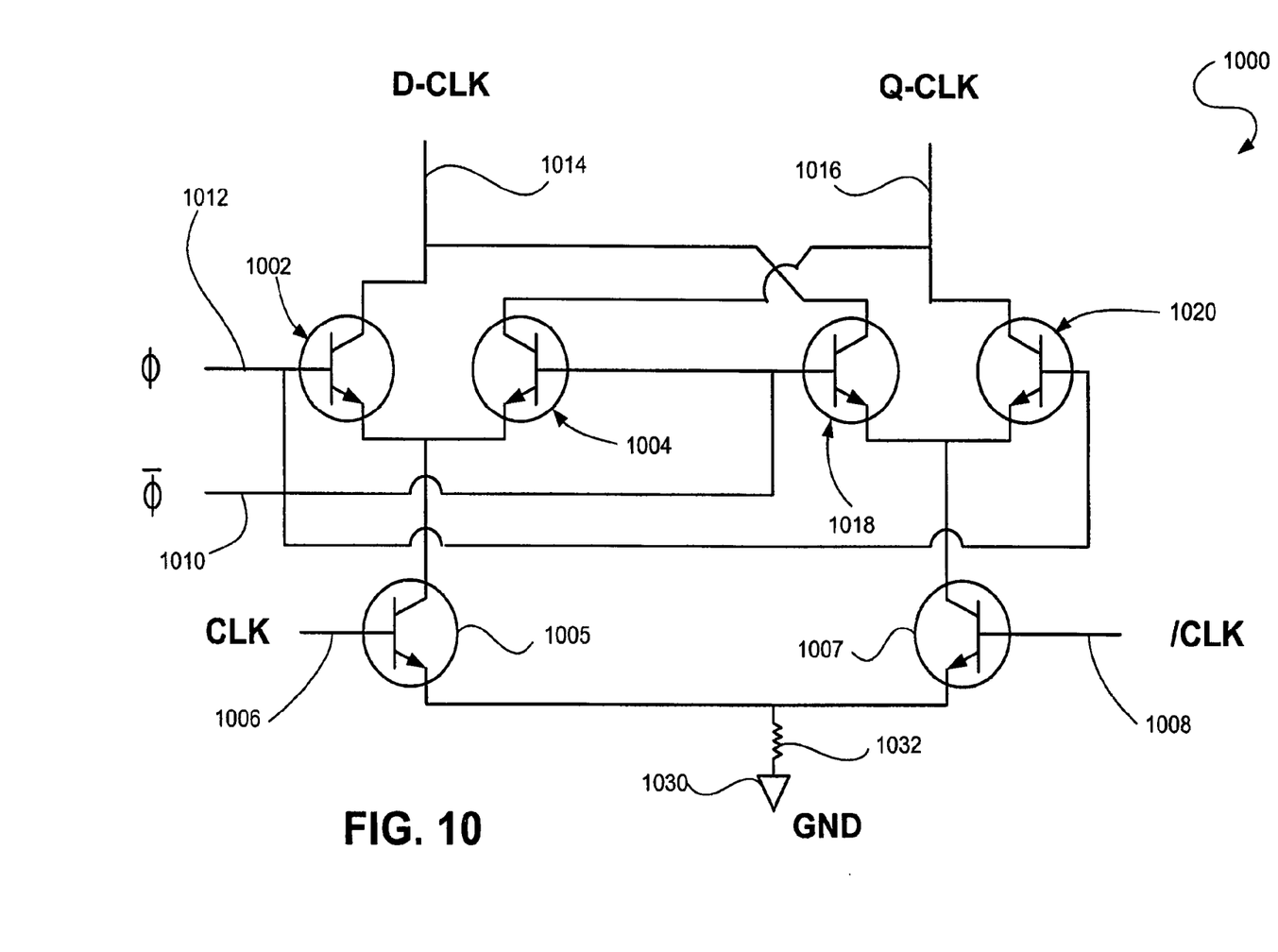
FIG. 10 is a block diagram illustrating one possible configuration of a clock phase module that can be used in a storage element of the invention.

FIG. 10 is a block diagram illustrating one possible configuration of a clock phase module 1000. Two differential pairs of NPN bipolar transistors are provided. The first pair includes transistors 1002 and 1004, and the second pair includes transistors 1018 and 1020. The emitter of transistor 1002 is coupled to the emitter of transistor 1004, and the emitter of transistor 1018 is coupled to the emitter of transistor 1020. The emitters of transistors 1002 and 1004 are coupled to the collector of transistor 1005, and the emitters of transistors 1018 and 1020 are coupled to the collector of transistor 1007. A connection 1006 containing a first clock signal ("CLK") is connected to the base of transistor 1005, and a connection 1008 containing a second clock signal ("/CLK") is connected to the base of transistor 1007 (where /CLK is the inverse of CLK).

The bases of transistors 1002 and 1020 are coupled together and to a connection 1012 that contains an incoming signal ϕ. In addition, the bases of transistors 1004 and 1018 are coupled together and to a connection 1010 containing an incoming signal /ϕ (where /ϕ is the inverse of ϕ). The collectors of transistors 1002 and 1018 are coupled together, and to an output connection 1014 containing an output signal D-CLK. The collectors of transistors 1004 and 1020 are also coupled together, and to an output connection 1016 containing an output signal Q-CLK (where Q-CLK is the inverse D-CLK).

CLK and /CLK represent a differential pair of input clock signals, ϕ and /ϕ represent a differential pair of phase control signals, and Q-CLK and D-CLK represent a differential pair of output clock signals. When ϕ is high and /ϕ is low, transistors 1002 and 1020 are active and transistors 1004 and 1018 are inactive. As a result, CLK is passed through transistors 1005 and 1002 to connection 1014 to form output clock signal D-CLK, and /CLK is passed through transistors 1007 and 1020 to connection 1016 to form output Q-CLK. Conversely, when ϕ is low and /ϕ is high, transistors 1004 and 1018 are active and transistors 1002 and 1020 are inactive. As a result, CLK is passed through transistors 1005 and 1004 to connection 1016 to form output signal Q-CLK, and input /CLK is passed through transistors 1007 and 1018 to connection 1014 to form output D-CLK.

Figure 11:
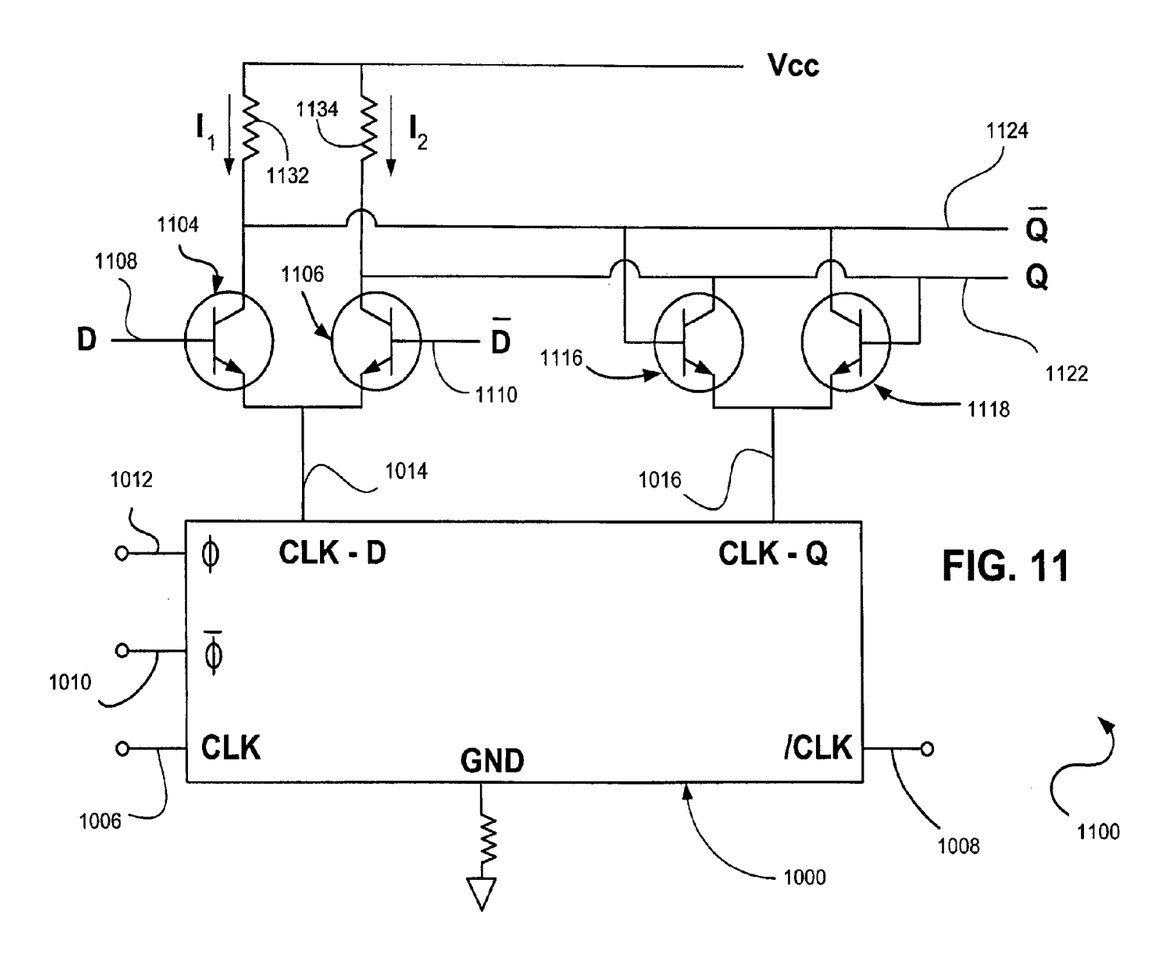
FIG. 11 is a block diagram illustrating one possible configuration of a storage element of the invention.

FIG. 11 is a block diagram illustrating one possible configuration of a storage element 1100 of the invention. Storage element 1100 may correspond, for example, to each of the storage elements 502, 504, and 506 shown in FIG. 5. Storage element 1100 includes a first differential pair of NPN bipolar transistors 1104 and 1106, a second differential pair of NPN bipolar transistors 1116 and 1118, and a clock phase module 1000.

The emitters of transistors 1104 and 1106 are coupled together and to connection 1014 containing the clock phase module output D-CLK. The collector of transistor 1104 is connected to $V_{cc}$ through resistor 1132, and the collector of transistor 1106 is connected to $V_{cc}$ through resistor 1134. An input signal D, is provided to the base of transistor 1104 via connection 1108, and the an input signal /D is provided to the base of transistor 1106 via connection 1110.

The emitters of transistors 1116 and 1118 are coupled together and to connection 1016 containing the clock phase module output Q-CLK. The collector of transistor 1116 is coupled to the collector of transistor 1106 and to the base of transistor 1118. The collector of transistor 1118 is coupled to the collector of transistor 1104, and to the base of transistor 1116.

When D-CLK goes high and Q-CLK goes low, transistors 1104 and 1106 become active, and transistors 1116 and 1118 become inactive. Under this condition, transistors 1104 and 1106 will "read" the states of D and /D from connections 1108 and 1110 respectively. Conversely, when Q-CLK goes high, and D-CLK goes low, transistors 1104 and 1106 become inactive, and transistors 1116 and 1118 become active. Under this condition, transistors 1116 and 1118 will "write" the states of D and /D (that were read immediately prior to the change in Q-CLK and D-CLK) onto connections 1122 and 1124 as outputs Q and /Q respectively.

Figure 12:
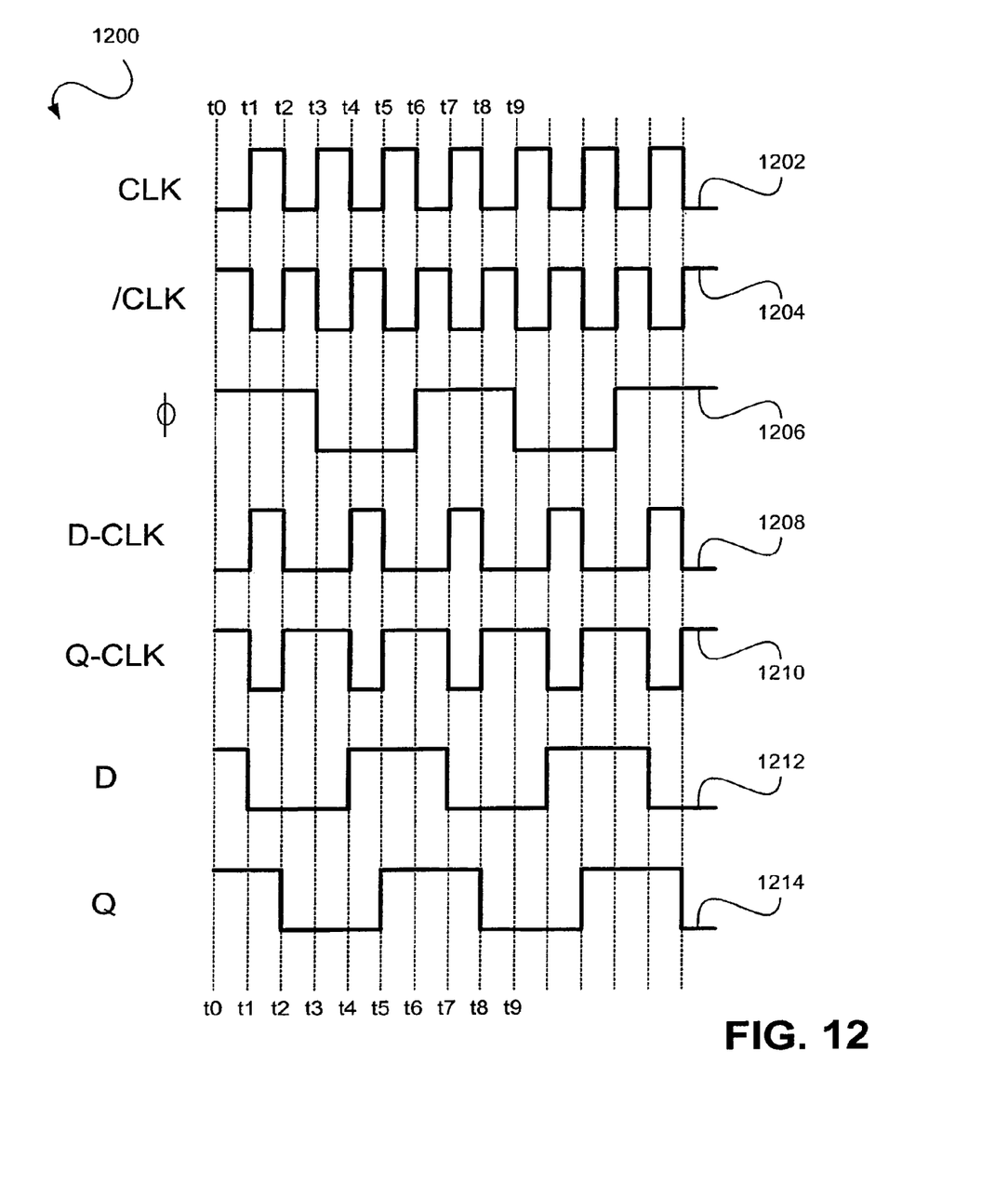
FIG. 12 is a simplified timing diagram illustrating the operation of storage element as part of a "divide by three" frequency divider.

With continued reference to FIG. 11, FIG. 12 is a simplified timing diagram 1200 illustrating the operation of storage element 1100 as part of a "divide by three" frequency divider, such as, for example, frequency divider 500 (FIG. 5). For illustration purposes, timing diagram 1200 does not show gradual transitions between states and does not show all possible inputs and outputs. The timing diagram 1200 shows the following signals: CLK 1202, /CLK 1204, φ 1206, D-CLK 1208, Q-CLK 1210, D 1212, and Q 1214. These signals (1202, 1204, 1206, 1208, 1210, 1212, and 1214) may correspond, for example, to the signals carried by connections 1006, 1008, 1012, 1014, 1016, 1108, and 1122, respectively.

CLK 1202, /CLK 1204, φ 1206, and D 1212 are input signals; D-CLK 1208 and Q-CLK 1210 are internal storage element signals that are based on input signals 1202, 1204, and 1206; and Q 1214 is an output signal that is based on the input D 1212 and the internal signals D-CLK 1208 and Q-CLK 1210. The state of D-CLK 1208 is substantially equivalent to the state of CLK 1202 when φ 1206 is high (for example, between $t_0$ and $t_3$), and is substantially equivalent to the state of /CLK 1204 when φ 1206 is low (for example, between $t_3$ and $t_6$). Q-CLK 1210 is effectively the inverse of D-CLK. Therefore, the state of D-CLK 1208 is substantially equivalent to the state of /CLK 1204 when φ 1206 is high (for example, between $t_0$ and $t_3$), and is substantially equivalent to the state of CLK 1202 when φ 1206 is low (for example, between $t_3$ and $t_6$).

During a time interval when the state of D-CLK 1208 is high (for example, between $t_1$ and $t_2$), the value of D 1212 is "read" by storage element 1100. Subsequently, when the value of Q-CLK 1210 goes high (for example, at time $t_2$), the value of D 1212 that was read when the state of D-CLK 1208 was high is written as the output Q 1214. The value of Q then remains unchanged until Q-CLK 1210 goes high again (for example, at time $t_5$). As a result, the frequency of the output Q 1214 will be equal to one third of the frequency of the input CLK 1202.

While various embodiments of the invention have been described, it will be apparent to those of ordinary skill in the art that many more embodiments and implementations are possible that are within the scope of this invention.

What is claimed is:

1. A signal processing system configured to produce a divider output signal having a period substantially equal to three times a period of a reference input signal, the signal processing system comprising:
    a first storage element;
    a second storage element; and
    a third storage element,
    where each of the three storage elements is configured to receive a first input, a second input, and a reference input signal, and is configured to provide a storage element output and a frequency of each output of the three storage elements has a frequency equal to one third of a frequency of the reference input signal,
    where the divider output signal is obtained from at least one storage element output, and where the divider output signal is obtained by combining only two of the three storage element outputs by adding or summing the two storage element outputs together, and
    where the storage element output from each of the three storage elements is used to provide at least one input to another one of the three storage elements, where a phase difference between the output of the first storage element and the output of the second storage element is substantially equal to 60°.

2. The signal processing system of claim 1, where each of the three storage elements comprises a plurality of transistors.

3. The signal processing system of claim 2, where with respect to each of the three storage elements, a state of the first input is stored in the storage element at a first point in time.

4. The signal processing system of claim 3, where a state of the storage element output at a second point in time subsequent to the first point in time is equal to the state of the first input stored in the storage element at the first point in time.

5. The signal processing system of claim 1, where a phase difference between a third harmonic component contained in the first storage element output and a third harmonic component contained in the second storage element output is substantially 180°.

6. The signal processing system of claim 5, where the third harmonic component contained in the first storage element output cancels out the third harmonic component contained in the second storage element output.

7. The signal processing system of claim 1, where the divider output signal has a duty cycle substantially equal to 50%.

8. The signal processing system of claim 1, where the reference input signal is a local oscillator signal.

9. The signal processing system of claim 1, where the signal processing system is a frequency divider.

10. The signal processing system of claim 1, where the signal processing system is implemented in a mobile communications device.

11. A method for producing a frequency divider output signal having a period substantially equal to three times a period of a reference input signal, comprising:
    configuring each of three storage elements to receive a first input, a second input, and a reference input signal, and to provide a storage element output, wherein a frequency of each output of the three storage elements has a frequency equal to one third of a frequency of the reference input signal;
    obtaining a frequency divider output signal from at least one storage element output, where the frequency divider output signal is obtained by combining only two of the three storage element outputs by adding or summing the two storage element outputs together; and
    using the storage element output from each of the three storage elements as an input to another one of the three storage elements, where a phase difference between the output of the first storage element and the output of the second storage element is substantially equal to 60°.

12. The method of claim 11, where each of the three storage elements comprises a plurality of transistors.

13. The method of claim 12, where with respect to each of the three storage elements, a state of the first input is stored in the storage element at a first point in time.

14. The method of claim 13, where a state of the storage element output at a second point in time subsequent to the first point in time is equal to the state of the first input stored in the storage element at the first point in time.

15. The method of claim 11, where a phase difference between a third harmonic component contained in the first storage element output and a third harmonic component contained in the second storage element output is substantially 180°.

16. The method of claim 15, where the third harmonic component contained in the first storage element output cancels out the third harmonic component contained in the second storage element output.

17. The method of claim 11, where the frequency divider output signal has a duty cycle substantially equal to 50%.

18. The method of claim 11, where the reference input signal is a local oscillator signal.

* * * * *